United States Patent [19]

Ninomiya et al.

[11] 4,040,081

[45] Aug. 2, 1977

[54] ALTERNATING CURRENT CONTROL CIRCUITS

[75] Inventors: Takeshi Ninomiya; Masaaki Sakai; Kiyosuke Suzuki, all of Tokyo, Japan

[73] Assignee: Sony Corporation, Tokyo, Japan

[21] Appl. No.: 567,275

[22] Filed: Apr. 11, 1975

[30] Foreign Application Priority Data

Apr. 16, 1974    Japan .................................. 49-42952

[51] Int. Cl.² ........................................... H01L 29/72
[52] U.S. Cl. ....................................... 357/34; 357/37; 357/89; 307/264; 307/297; 307/303
[58] Field of Search ....................... 357/23, 34, 89, 43, 357/37; 307/297, 303, 264

[56] References Cited

U.S. PATENT DOCUMENTS

| 3,204,160 | 8/1965 | Sah ......................................... 357/23 |
| 3,289,009 | 11/1966 | Groodis ................................. 357/23 |
| 3,397,326 | 8/1968 | Gallagher et al. ..................... 357/43 |
| 3,748,500 | 7/1973 | Tam ...................................... 307/297 |
| 3,755,793 | 8/1973 | Ho et al. ............................... 357/23 |

FOREIGN PATENT DOCUMENTS 906,036    9/1962    United Kingdom ................... 357/89

*Primary Examiner*—Michael J. Lynch
*Assistant Examiner*—Joseph E. Clawson, Jr.
*Attorney, Agent, or Firm*—Hill, Gross, Simpson, Van Santen, Steadman, Chiara & Simpson

[57] ABSTRACT

A novel circuit is provided for controlling an alternating current supplied to a load which includes a variable impedance element in the form of a low emitter concentration transistor which is bidirectional, and which has a high gain. The impedance of the variable impedance element to the flow of current therethrough is substantially the same in either direction of current flow.

6 Claims, 5 Drawing Figures

ALTERNATING CURRENT CONTROL CIRCUITS

BACKGROUND OF THE INVENTION

1. Field of the Invention

This invention relates generally to control circuits for controlling the magnitude of an alternating current, and more particularly to alternating current control circuits utilizing a semiconductor device as a variable impedance element to an alternating current supplied to a load.

2. Description of the Prior Art

There have been proposed several alternating current control circuits for controlling manually or automatically the operation of apparatus which operates from an alternating current. Such apparatus may, for example, be an AC (alternating current) motor. In such circuits, a variable impedance device or circuit has been provided in the path of the alternating current supplied to the apparatus and the impedance value of the variable impedance device has been made variable to control the magnitude of the alternating current passing therethrough. Generally, it is required for the variable impedance device or circuit used for controlling the magnitude of the alternating current to have bidirectional conductivity with the same impedance value to current flow either direction. To comply with the requirement, it has been previously proposed to use a diode-bridge circuit having four arms, each arm including a diode, and one pair of opposed connection points each provided between the arms adjacent each other which are connected to the path of the alternating current supplied to the apparatus and the other pair of opposed connection points being provided between the arms adjacent each other which are connected respectively to, for example, a collector and an emitter of a transistor which is supplied with a control signal between its base and the emitter to change the impedance value between the collector and the emitter. Each half cycle of the alternate current supplied to the apparatus flows through the collector-emitter path of the transistor in the same direction as a result of passing through the diode-bridge circuit and therefore the magnitude of every half cycle of the alternative current can be controlled by the transistor in the same manner though the transistor is substantially a device of unidirectional conductivity.

However, in such previously proposed circuits mentioned above, there is the disadvantage that it is difficult to supply a controlled alternating current smoothly to the apparatus because the alternating current passing through the diode-bridge circuit is given a discontinuous wave form by the switching operation of the diode therein. In the case where the apparatus to be controlled is an AC motor, the supply of such an alternating current having the discontinuous wave form causes the AC motor to generate an undesirable spike noise. Furthermore, there is the additional disadvantage that a relatively large number of circuit elements are required.

SUMMARY OF THE INVENTION

It is an object of the present invention to provide an alternating current control circuit in which the above mentioned disadvantages inherent in the prior art is avoided by utilizing a novel semiconductor device acting as a variable impedance element.

Another object of the present invention is to provide an alternating current control circuit having a novel and simplified circuit structure formed with a novel semiconductor device having bidirectional and variable conductivity.

It is a further object of the present invention to provide a novel and distinctive circuit arrangement employing a variable impedance device in a current supply circuit for an alternating current apparatus such as an alternating current motor. The variable impedance device is in the form of a bidirectional transistor having the characteristic that its impedance is the same in both directions of current flow but whose bidirectional impedance can be varied. The novel variable impedance device is an LEC (low emitter concentration) transistor which is bidirectional and has high gain.

This invention provides a circuit for controlling the magnitude of an alternating current supplied to an alternating current apparatus to be controlled, a source for supplying the alternating current to the apparatus and a novel semiconductor device of the three-terminal type, a current path between first and third terminals of which is connected in series to the apparatus and second terminal of which is connected with a control circuit, such as a variable biasing current source. The impedance value of the current path between the first and third terminals of novel semiconductor device is changed by the control circuit thereby to control the magnitude of the alternating current.

The novel semiconductor device is constituted in the form of three terminals with a semiconductor body similar to an ordinary transistor and able to act as an amplifying device, switching device or variable impedance device like the ordinary transistor. One of the distinctive features of the novel semiconductor device resides in its bidirectional conductivity with forward and reverse impedance values substantially equal to each other.

Other objects, features and advantages of the present invention will become apparent from the following description taken in conjunction with the accompanying drawings.

DESCRIPTION OF THE PREFERRED EMBODIMENTS

Figure 1:
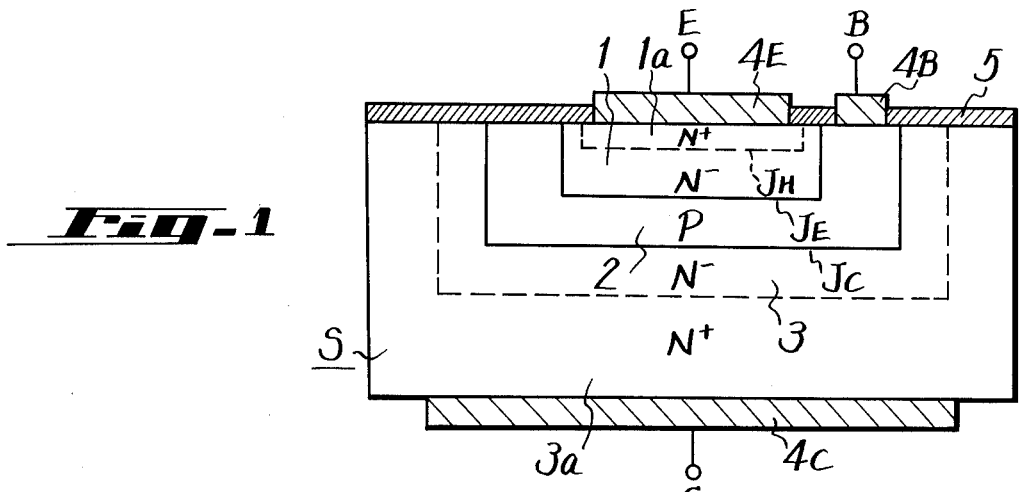
FIG. 1 is a diagrammatic view of one embodiment of a bidirectional variable impedance semiconductor device.

Before describing the circuit of the present invention, an embodiment of the novel semiconductor device usable in the circuit of the present invention will be described.

The emitter-grounded current amplification factor $h_{FE}$ of a transistor, which is one of parameters evaluating the characteristics of a bipolar transistor, can be expressed by the following equation (1), if the basegrounded current amplification factor of the transistor is taken as $\alpha$.

$$h_{FE} = \alpha/(1-\alpha) \qquad (1)$$

The factor $\alpha$ is expressed as follows:

$$\alpha + \alpha^* \beta \gamma \qquad (2)$$

where $\alpha^*$ represents the collector amplification factor, $\beta$ the base transfer efficiency and $\gamma$ the emitter injection efficiency, respectively.

Now, if the emitter injection efficiency $\gamma$ of an NPN-type transistor is taken into consideration, $\gamma$ is given by the following expression (3).

$$\gamma = \frac{J_n}{J_n + J_p} = \frac{1}{1 + \frac{J_p}{J_n}} \qquad (3)$$

where $J_n$ represents the current density of electrons injected from the emitter to the base of the transistor, and $J_p$ the current density of holes injected from the base to the emitter of the transistor, respectively.

Since $J_n$ and $J_p$ are expressed by the following equations (4) and (5), respectively, $$J_n = \frac{qD_n n_p}{L_n}\left(\exp\left(\frac{qV}{kT}\right) - 1\right) \qquad (4)$$

$$J_p = \frac{qD_p p_n}{L_p}\left(\exp\left(\frac{qV}{kT}\right) - 1\right) \qquad (5)$$

the ratio $\delta$ of $J_n$ and $J_p$ is expressed as follows:

$$\delta = \frac{J_p}{J_n} = \frac{L_n}{L_p} \cdot \frac{D_p}{D_n} \cdot \frac{P_n}{n_p} \qquad (6)$$

where $L_n$ represents the diffusion distance of the minority carriers in the base of the transistor; $L_p$ the diffusion distance of the minority carriers in the emitter of the transistor; $D_n$ the diffusion constant of the minority carriers in the base; $D_p$ the diffusion constant of the minority carriers in the emitter; $n_p$ the concentration of the minority carriers in the base under the equilibrium state; $p_n$ the concentration of the minority carriers in the emitter under the equilibrium state; V a voltage applied to the emitter junction of the transistor; $k$ the Boltzmann's constant; T the temperature; and $q$ the absolute value of electron charge.

If it is assumed that the impurity concentration in the emitter of the transistor is taken as $N_D$ and that in the base of the transistor taken as $N_A$, the term $p_n/n_p$ can be replaced by the term $N_A/N_D$. Further, since $L_n$ is restricted by the base width W and $L_n = W$, the ratio $\delta$ is expressed as follows:

$$\delta = \frac{W}{L_p} \cdot \frac{D_p}{D_n} \cdot \frac{N_A}{N_D} \qquad (7)$$

The diffusion constants $D_n$ and $D_p$ are functions of transfer of the carrier and temperature, and in this case they are assumed constant substantially.

As may be obvious from the above respective equations, in order to increase the current amplification factor $h_{FE}$ of a transistor, it is sufficient to make the ratio $\delta$ small.

Therefore, in an ordinary transistor, the impurity concentration $N_D$ of its emitter is selected high enough so as to make the ratio $\delta$ small.

However, if the impurity concentration of the emitter is selected sufficiently high, for example, more than $10^{19}$ atoms/cm$^3$, lattice defects and dislocation occur in the crystal of the semiconductor body of the transistor to deteriorate the crystal. Further, due to the fact that the impurity concentration of the emitter itself is high, a life time $\tau_p$ of the minority carriers injected to the emitter from the base becomes short.

Since the diffusion distance $L_p$ is expressed by the following equation (8)

$$L_p = \sqrt{D_p \tau_p} \qquad (8)$$

the diffusion distance $L_p$ of the minority carriers or holes becomes short. Therefore, as may be apparent from the equation (7), $\delta$ can not be made small and hence the injection efficiency $\gamma$ can not be made high over a certain value. As a result, the current amplification factor $h_{FE}$ can not be made very high in the ordinary transistor.

As mentioned previously, the novel semiconductor device usable in this invention is free from the defects mentioned just above inherent to the prior art transistor. The semiconductor device used in this invention is an NPN-type but a PNP-type one may be used. An NPN-type semiconductor device will not be described.

As shown in FIG. 1, the NPN-type semiconductor device consists of a first semiconductor region 1 of N$^-$ type conductivity formed in a semiconductor substrate S of N$^+$ type conductivity, a second semiconductor region 2 of P type conductivity formed in the semiconductor substrate S adjacent the first region 1, and a third semiconductor region 3 of N$^-$ type conductivity formed in the substrate S adjacent the second region 2 to form a first PN-junction $J_E$ between the first and second regions 1 and 2 and a second PN-junction $J_c$ between the second and third regions 2 and 3, respectively.

With the semiconductor device shown in FIG. 1, at the position facing the first junction $J_E$ and apart from it by a distance smaller than the diffusion distance $L_p$ of the minority carriers injected from the second region 2 to the first region 1, a potential barrier having an energy level higher than that of the minority carriers is formed in the first region 1. In the example of FIG. 1, the impurity concentration in the first region 1 is selected low, such as in the order of $10^{15}$ atoms/cm$^3$, and the region 1a of N$^+$ type conductivity selected to have a high impurity concentration of about $10^{19}$ atoms/cm$^3$ is formed in the first region 1, thereby to provide an LH-junction and hence to form the barrier.

The impurity concentration in the second region 2 is selected in the order of $10^{15}$ to $10^{17}$ atoms/cm$^3$ and that in the third region 3 is selected sufficiently low such as in the order of $10^{15}$ atoms/cm$^3$.

In the semiconductor substrate S adjacent to the third region 3 but apart from the second junction $J_c$, there is formed a region 3a of N$^+$ type conductivity and having an impurity concentration of about $10^{19}$ atoms/cm$^3$.

A first electrode 4E is formed on the high impurity concentration region 1a to have an ohmic contact therewith. A second electrode 4B is formed on the second region 2 in ohmic contact therewith, and a third electrode 4C is formed on the high impurity concentration region 3a adjacent the third region 3 in ohmic contact therewith, respectively. From these electrodes 4E, 4B and 4C, there are led out first, second and third terminals E, B and C, respectively. In FIG. 1, reference numeral 5 indicates an insulating layer made of, for example, $SiO_2$ formed on the surface of the substrate S.

The semiconductor device shown in FIG. 1 can be used as a transistor. In such a case, the first region 1 serves as an emitter region, the second region 2 as a base region; and the third region 3 as a collector region. A forward bias is applied to the emitter junction $J_E$ and a reverse bias is applied to the collector junction $J_C$.

Thus, the holes injected from the base or the second region 2 to the emitter or first region 1 have a long life period of time due to the fact that the emitter region 1 has low impurity concentration and good crystal property, and hence, the diffusion distance $L_p$ of the holes in the emitter region 1 becomes long. As a result, as may be apparent from the equations (6) and (3), the emitter injection efficiency $\gamma$ can be made high. However, in the case where the diffusion distance $L_p$ is long, the injected holes into the emitter region 1 may arrive at the surface of the substrate S and may be recombined with electrons on the surface. With the semiconductor device shown in FIG. 1, since the potential barrier is formed in the emitter region 1, with the potential barrier facing the emitter junction $J_E$, at a position which is located at a distance smaller than the diffusion distance $L_p$, of the minority carrier, the amount of the surface-recombination is reduced and the diffusion distance $L_p$ can be made sufficiently long.

Due to the fact that the potential barrier is formed as described above in the example shown in FIG. 1, the current density or component $J_p$ of the holes injected from the base region 2 to the emitter region 1 is reduced. That is, on the LH-junction $J_H$ in the emitter region 1, there is caused a false Fermi level difference or built-in electric field which acts to suppress the diffusion of the holes or the minority carriers. Therefore, if the Fermi level is sufficiently high, the diffusion current caused by the concentration gradient of holes and the drift current caused by the built-in electric field are cancelled at the LH-junction to reduce the hole current $J_p$ injected from the base 2 through the emitter region 1 of low impurity concentration. By this effect, the ratio of electron current arriving at the collector region 3 relative to the current component passing through the emitter junction $J_E$ is increased and hence the emitter injection efficiency $\gamma$ is increased as apparent from the equation (3) to make the current amplification factor $h_{FE}$ high.

The above level difference (the height of the potential barrier) must be more than the energy of holes or at least the heat energy. The heat energy can be approximated as kT but the above level difference is desired to be more than 0.1 eV. Within the transition region of the potential, the diffusion distance $L_p$ of the holes must be not terminated within the transition region, or it is required that the diffusion distance $L_p$ of the hole must be greater than the width of the transition region.

In the case where the LH-junction $J_H$ is formed as shown in FIG. 1, a potential barrier of 0.2 eV can be formed by suitably selecting the amount of impurity and gradient of the high impurity concentration region 1a.

Figure 2:
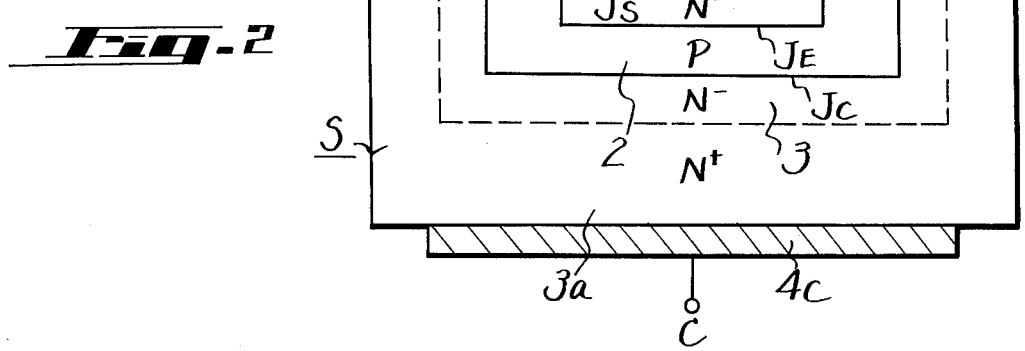
FIG. 2 is a diagrammatic view of a second embodiment of a bidirectional variable impedance semiconductor device.

FIG. 2 shows another example of the semiconductor device usable with the invention in which reference numerals and letters are the same as those used in FIG. 1 where applied to similar parts to those of FIG. 1.

In the example of FIG. 2, in order to form a PN-junction $J_S$ facing the first or emitter junction $J_E$, an additional region 6 of P-type conductivity is formed in the first region 1. In the example of FIG. 2, the distance between the junctions $J_S$ and $J_E$ is selected smaller than the diffusion distance $L_p$ of the minority carriers in the first region 1. The other construction of the example shown in FIG. 2 is substantially the same as that of the example shown in FIG. 1.

With the example of FIG. 2, since the diffusion distance $L_p$ of the holes injected into the first region 1 is long as described above, the holes arrive at the additional region 6 effectively and then are absorbed thereby. When the additional region 6 is floated from electrical point of view, its potential is increased as the number of holes arriving at the additional region 6 is increased. Thus, the PN junction $J_S$ formed between the regions 6 and 1 is biased forwardly to its rising-up voltage, and holes will be re-injected into the first region 1 from the additional region 6. Thus, the concentration of holes in the first region 1 near the additional region 6 will be increased, and accordingly, the concentration distribution of holes between the junctions $J_E$ and $J_S$ in the first region 1 is made uniform and the gradient thereof becomes gradual to reduce the diffusion current $J_p$ from the second region 2 to the first region 1.

In the example of FIG. 2, the additional region 6 which has the same conductivity type as that of the second region 2 is formed in the first region 1 separated from the second region 2, but it may be possible that the second region 6 is formed being continuously extended from the second region 2 around the end of region 1.

The above description is made on the assumption that the first, second and third regions 1, 2 and 3 of the semiconductor device are operated as emitter, base and collector, respectively. However, in the above semiconductor devices the impurity concentrations of the first and third regions 1 and 3 surrounding the second region 2 are selected low of about equal order and they are arranged symmetrically with respect to the second region 2, so that if the first, second and third regions 1, 2 and 3 are acted as, collector, base and emitter, respectively, the semiconductor devices can be operated as a transistor reverse in the operating direction to those mentioned previously.

When the symmetry of the semiconductor device is utilized, the symmetry can be emphasized by forming in the third region 3 a potential barrier facing the second junction $J_C$, surrounding the same and having the energy higher than that of the minority carrier or hole in the third region 3 as shown in FIGS. 1 and 2 by dotted lines outside the junction $J_C$. To this end, the region 3a of high impurity concentration in the third region 3 is so formed to surround the junction $J_C$ and the distance between the junction $J_C$ and the region 3a is selected smaller than the diffusion distance of the minority carriers or holes injected to the third region 3.

The features of the novel semiconductor devices described above can be summarized as follows which will be apparent from the above description.

1. The current amplification factor $h_{FE}$ is high and can be increased to more than 3000.

2. The current amplification factor $h_{FE}$ is uniform. That is, with a prior art transistor, the impurity concentration of the emitter region is selected sufficiently high so as to increase the emitter injection efficiency. The current amplification factor of the prior art transistor depends upon the difference of the impurity concentrations near the junction between the emitter and base regions, so it requires proper selection of the impurity concentrations to accomplish this. On the contrary, in the semiconductor devices for use with this invention, by forming the potential barrier in the emitter region 1 facing the emitter junction $J_E$, the current component of the minority carriers injected in the emitter region 1 is suppressed to increase the emitter injection efficiency, so that the mutual influence between the emitter and base regions 1 and 2 is small due to the fact that the emitter region 1 is selected relatively low in impurity concentration, and the width of the base region 2 and the distribution of impurity concentration therein can be selected as planned and hence $h_{FE}$ can be uniform as described above.

3. Since the affect by the surface recombination is avoided, the current amplification factor $h_{FE}$ can be made high even if the current is low.

4. Noise can be reduced. That is, since the main parts of the first and second junctions $J_E$ and $J_C$ are formed between the low impurity concentration regions of P and N conductivity types, crystal defects are small. Further, if the impurity concentration near the electrode 4B attached to the second region 2, by way of example, is selected high, a component of the emitter-base current, as a transistor, along the surface of the semiconductor substrate S can be reduced. Therefore, the noise of $1/f$ can be reduced. Further, the burst noise and noise of $1/f$ can be also reduced by the fact that $h_{FE}$ is high. In addition, if a base expansion resistance $\gamma_{bb}'$ is made small, the noise can be reduced even if the impedance of a signal source is low.

5. The current amplification factor $h_{FE}$ has good temperature characteristics.

6. The semiconductor devices can be used as bidirectionally conductive transistors, respectively, and have excellent symmetry.

7. Since the impurity concentration in the vicinity of the first and second junctions $J_E$ and $J_C$ is low, $BV_{BEO}$ (collector-opened base-emitter voltage) is high for both the forward and reverse directions of the transistors.

8. When the semiconductor devices are used as a power transistor, their strength is high because their emission is made uniform by their distributed inner resistance in their emitter region.

9. The saturation characteristics are superior.

10. When the region 6, which carrier out injection or re-injection, if formed, the equivalent resistance of the base is made low.

Figure 3:
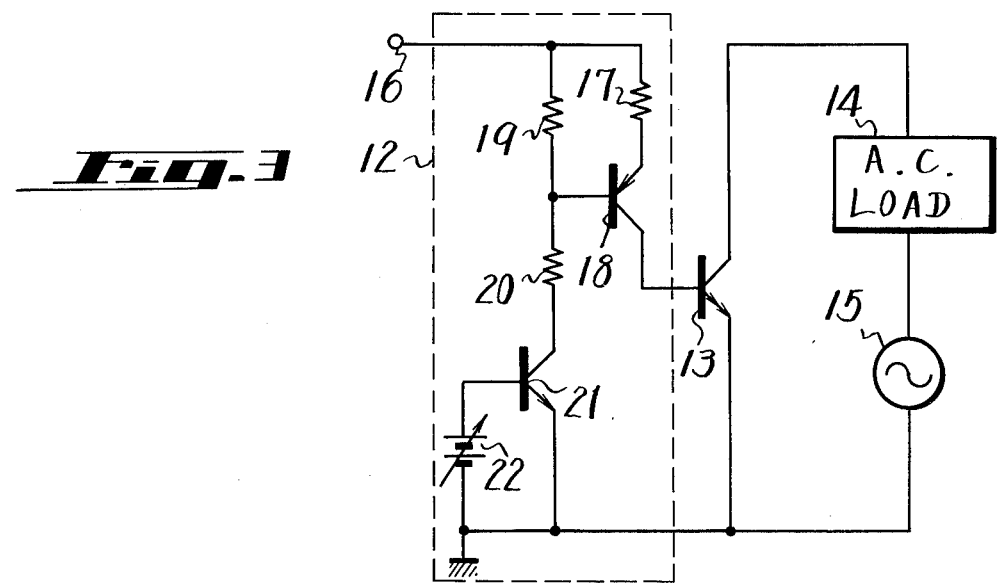
FIG. 3 is a circuit diagram of a first preferred embodiment of a current supply circuit to an AC load, which circuit has therein the variable bidirectional impedance device of the present invention.

FIG. 3 of the drawings illustrates diagrammatically a current supply circuit on an AC load employing a variable impedance device such as either one of those above described. As shown, an alternating current load 14, such as an alternating current motor is supplied with current from an alternating current source 15 through a variable impedance device 13.

The variable impedance device 13 is a bidirectional LEC (low emitter concentration) transistor such as a transistor of the type shown in either of FIGS. 1 or 2. The symbolic indication of a bidirectional LEC transistor is indicated by using a double headed arrow for the emitter.

The impedance of the device 13 is varied by varying the base-emitter voltage. A voltage source 16 is connected through a resistor 17 to the collector of a conventional transistor 18. The collector of the transistor 18 is connected to the base of the LEC transistor 13. The voltage source 16 is also connected through a resistor 19 and a resistor 20 to the collector of a conventional transistor 21. The emitter of the transistor 21 is connected to a reference potential which here is shown as ground. A variable potential bias source 22 is provided between the base of transistor 21 and the emitter of transistor 21. This variable potential bias source is represented by a battery, whose voltage may be varied. The mid-point between resistors 19 and 20 is connected to the base of transistor 18. The dotted line 12 indicates a variable current source supplying a DC current with a variable value to the variable impedance device 13. By varying the base emitter current of the device 13, the current supplied to the AC load 14 may be varied.

Figure 4:
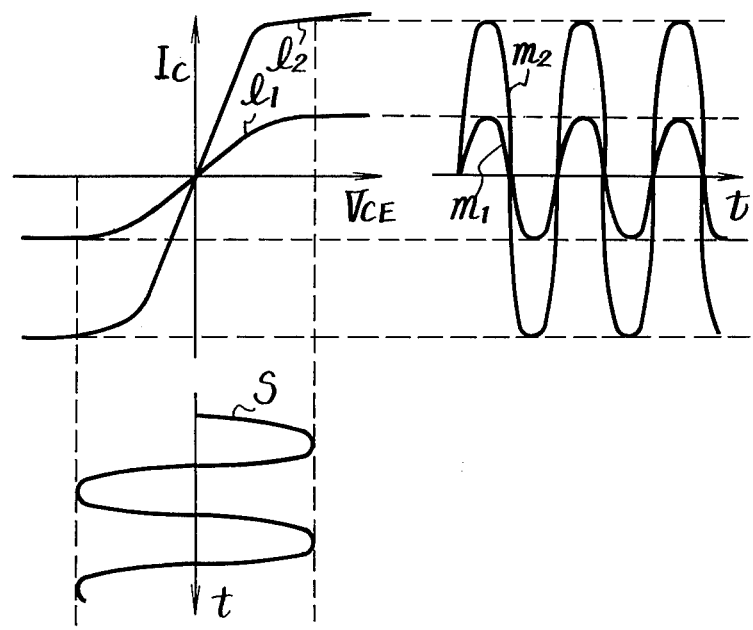
FIG. 4 is a wave form diagram.

The operation of the embodiment of FIG. 3 is illustrated in FIG. 4. The collector-emitter voltage of the variable impedance device 13 is indicated as $V_{CE}$. This represents the difference between the first and third electrodes E and C of the semiconductor device 13, as shown in FIG. 1, for example. $I_C$ is a current flowing through the path between the first and third electrodes E and C of the semiconductor device 13. $I_B$ is the current flowing in the second electrode B of the semiconductor device 13.

Curve $l_1$ shows the relation between $I_C$ and $V_{CE}$ which corresponds to the relation between the collector current and the collector-emitter voltage for an ordinary transistor. In the case where $I_B = I_{B1}$ and the curve $l_2$ shows the relation between $I_C$ and $V_{CE}$ in the case where $I_B = I_{B2}$, where $I_{B2} > I_{B1}$. In the case of the ordinary transistor, the $i_c - v_{ce}$ curve of the relation between the collector current and the collector-emitter voltage corresponds to $l_1$ or $l_2$ as quite a different form in accordance with the direction of the collector current. Generally, as for an NPN transistor, when the collector current flows in the forward direction, that is from its collector to its emitter, the $i_c - v_{ce}$ curve has almost the same form as $l_1$ or $l_2$. However, when the collector current flows in the reverse direction, that is, from its emitter to its collector, the $i_c - v_{ce}$ curve has a form much closer to the abscissa of $v_{ce}$ than $l_1$ or $l_2$ because in the ordinary transistor, the reverse collector current is relatively small. In the novel semiconductor device of the present invention, $I_C$ can flow equally well in both directions from the first electrode to the third electrode and from the third electrode to the first electrode. As a result, $l_1$ and $l_2$ become symmetrical with respect to a null point.

Accordingly, when an AC voltage S of, for example, a sin wave, is supplied between the first and third electrodes of the semiconductor device 13 from the alternating current source 15, an alternating current $I_L$ flows through the load 14 with sin wave symmetry with respect to the null point and the magnitude is determined in accordance with the curve $l_1$ or $l_2$, shown as $m_1$ or $m_2$.

The magnitude of the alternating current $I_L$ flowing through the load 14 may be varied in accordance with the curves of the relation between $I_C$ and $V_{CE}$. That is, the magnitude of the current $I_L$ is controlled by controlling the current $I_B$ supplied from the variable current source 12 to the semiconductor device 13 which varies the impedance in the current supply from the alternating current source 15 to the alternating current load 14.

Figure 5:
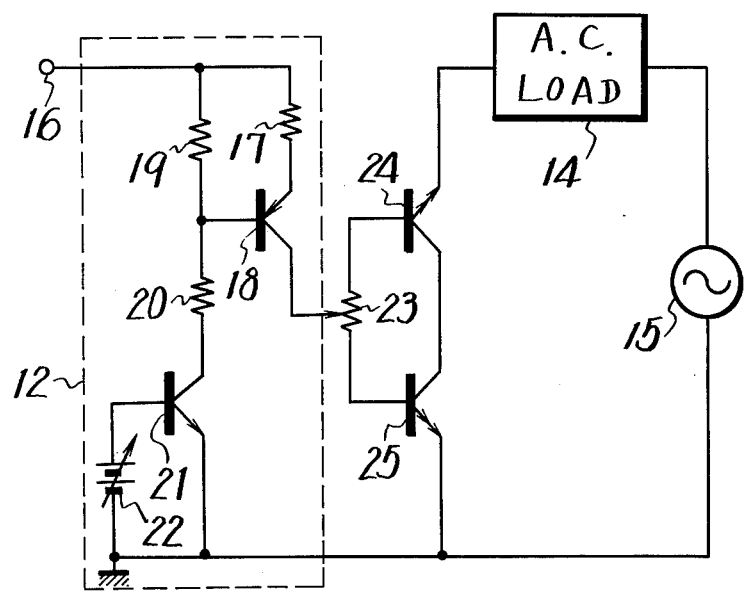
FIG. 5 is a second embodiment of the present invention in which two variable impedance devices of the present invention are employed in the current supply circuit to the AC load.

In the embodiment of the invention shown in FIG. 5, the variable impedance device is provided by a pair of variable impedance elements 24 and 25 connected in series in the current supply line from the AC source 15 to the AC load 14. The variable impedance elements 24 and 25 are of a type such as shown in FIG. 1 and FIG. 2 of the drawings, and these are connected in series. The base of the two LEC transistors 24 and 25 are connected together through a potentiometer 23. The variable current source 12 is included in FIG. 5, which is the same as that shown in FIG. 3. The potentiometer 23 acts as a balance resistor for controlling a balance in the current supplied from the variable current source 12 to the base of each variable impedance device 24 and 25.

By using two semiconductor variable impedance devices connected in series, a relatively large AC voltage can be supplied across the semiconductor device.

With reference to the semiconductor devices shown in FIGS. 1 and 2, cross reference is made to Ser. Nos. 427,648 and 427,647, respectively, which are assigned to the same assignee as the present invention.

It will be apparent to those skilled in the art that many modifications and variations may be effected without departing from the spirit and scope of the novel concepts of the present invention.

We claim as our invention:

1. A control circuit for varying the impedance of the current supply line from an AC source to an AC load which includes a bidirectional continuously variable impedance semiconductor device connected in said current supply line, said semiconductor device comprising a first semiconductor region of one conductivity type, a second semiconductor region of the opposite conductivity type adjacent said first region with a first semiconductor junction therebetween, a third semiconductor region of the same type as said first region adjacent said second region with a second semiconductor junction therebetween, said first region having a first potential barrier formed therein having energy higher than that of the minority carriers injected from the second region to the first region at a position facing said first junction and spaced from the same by a distance smaller than the diffusion distance of the minority carriers, said third region having a second potential barrier formed therein and having an energy higher than minority carriers injected from the second region to the third region at a position facing said second junction and spaced from the same by a distance smaller than the diffusion distance of the minority carriers, said first and third regions of the semiconductor device each having a first portion with an impurity concentration of substantially the same order of magnitude respectively adjacent the first and second semiconductor junctions, first, second and third terminals coupled to said first, second and third regions, respectively, said first and third terminals connecting the semiconductor device in the supply line, means for causing a DC base current to flow through said second terminal of said semiconductor device, and means for selectively adjusting the magnitude of the DC base current continuously to vary the amplitude of the alternating current flowing through said semiconductor device whereby said alternating current has a substantially continuous waveform free of undesirable discontinuities.

2. A control circuit according to claim 1, in which said first region has provided therein a second portion having an impurity concentration higher than said first portion of the first region at a position spaced from said first junction by a distance smaller than the diffusion distance of the minority carriers to establish said first potential barrier.

3. A control circuit according to claim 1, in which an additional semiconductor region of the same conductivity type as said second region is provided in contact with said first region at a position spaced from said first junction by a distance smaller than the diffusion distance of the minority carriers to establish said first potential barrier.

4. A control circuit according to claim 1, in which said adjustable DC current supplied to the second terminal of said semiconductor device is provided by a voltage biasing network comprising first and second transistors of the NPN and PNP type, respectively, the collector-emitter circuit of said NPN transistor being connected through a pair of serially connected resistors between a DC potential source and ground, the emitter-collector circuit of said PNP transistor being connected through a resistor between said DC potential source and said second terminal of said semiconductor device, said resistor being on the emitter side of said PNP transistor, an adjustable voltage biasing source connected between the base of said NPN transistor and ground, and the base of said PNP transistor being connected to the mid-point of said serially connected resistors.

5. A control circuit according to claim 1, in which a second bidirectional variable impedance semiconductor device similar to said first bidirectional device is connected in said current supply line and said means for causing a DC base current to flow also being connected to a second terminal of said second semiconductor device.

6. A control circuit according to claim 5, in which said means for selectively adjusting the magnitude of the DC base current includes a resistor connected between the second terminals of the first and second semiconductor devices, said resistor having a variable tap connected to said means for selectively adjusting the magnitude of the DC base current.

* * * * *